US012701357B2

(12) United States Patent
Zhou

(10) Patent No.: US 12,701,357 B2
(45) Date of Patent: Aug. 4, 2026

(54) AUDIO SIGNAL PROCESSING METHOD AND APPARATUS, ELECTRONIC DEVICE, AND STORAGE MEDIUM

(71) Applicant: VIVO MOBILE COMMUNICATION CO., LTD., Dongguan (CN)

(72) Inventor: Yao Zhou, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 274 days.

(21) Appl. No.: 18/370,874

(22) Filed: Sep. 20, 2023

(65) Prior Publication Data

US 2024/0015435 A1 Jan. 11, 2024

Related U.S. Application Data

(63) Continuation of application No. PCT/CN2022/081957, filed on Mar. 21, 2022.

(30) Foreign Application Priority Data

Mar. 25, 2021 (CN) .......................... 202110321004.X

(51) Int. Cl.
H04R 3/00 (2006.01)
H03G 3/30 (2006.01)
H04R 3/08 (2006.01)

(52) U.S. Cl.
CPC ........... H04R 3/007 (2013.01); H03G 3/3005 (2013.01); H04R 3/08 (2013.01); *H03G 2201/103* (2013.01); *H04R 2430/01* (2013.01)

(58) Field of Classification Search
CPC ...... H04R 3/007; H04R 3/08; H04R 2430/01; H04R 9/022; H03G 3/3005;
(Continued)

(56) References Cited

U.S. PATENT DOCUMENTS 6,865,274 B1 * 3/2005 Aarts ..................... H04R 3/007
381/98
7,274,793 B2 * 9/2007 Combest ................ H04R 3/002
381/98
(Continued)

FOREIGN PATENT DOCUMENTS

CN 109511059 A * 3/2019 .............. H04R 9/06
CN 110308888 A 10/2019
(Continued)

OTHER PUBLICATIONS

International Search Report issued in corresponding International Application No. PCT/CN2022/081957, mailed May 27, 2022, 5 pages.
(Continued)

*Primary Examiner* — Xu Mei
(74) *Attorney, Agent, or Firm* — IPX PLLC

(57) ABSTRACT

This application discloses an audio signal processing method and apparatus, an electronic device, and a storage medium. The method includes: determining, when a first audio signal is a single-frequency signal or a frequency-sweeping signal and a frequency point of the first audio signal belongs to a target frequency band, a power protection gain based on a power and the frequency point of the first audio signal; and performing compression processing on the first audio signal based on the power protection gain.

20 Claims, 8 Drawing Sheets

(58) Field of Classification Search
CPC .. H03G 2201/103; H03G 7/008; H03F 3/181;
H03F 2200/03
USPC ............................................. 381/55, 98, 106
See application file for complete search history.

(56)                    References Cited

U.S. PATENT DOCUMENTS

| | | | | |
|---|---|---|---|---|
| 10,897,670 | B1 * | 1/2021 | Yang .................... | H04R 29/001 |
| 11,750,993 | B2 * | 9/2023 | Chen ........................ | H04R 3/04 |
| | | | | 381/58 |
| 2015/0215704 | A1 | 7/2015 | Magrath et al. | |
| 2017/0111736 | A1 * | 4/2017 | Ge ............................ | H03F 3/68 |
| 2018/0014121 | A1 | 1/2018 | Lawrence et al. | |
| 2018/0352329 | A1 | 12/2018 | Klingler et al. | |

FOREIGN PATENT DOCUMENTS

| | | | | | |
|---|---|---|---|---|---|
| CN | 111010650 | A | | 4/2020 | |
| CN | 111385714 | A | | 7/2020 | |
| CN | 111479198 | A | * | 7/2020 | .............. H04R 9/06 |
| CN | 113099352 | A | | 7/2021 | |
| EP | 3379847 | A1 | * | 9/2018 | ............ H03G 7/002 |
| WO | 2016155853 | A1 | | 10/2016 | |

OTHER PUBLICATIONS

First Office Action issued in related Chinese Application No. 202110321004.X, mailed Feb. 18, 2022, 9 pages.
Second Office Action issued in related Chinese Application No. 202110321004.X, mailed Oct. 12, 2022, 8 pages.

* cited by examiner

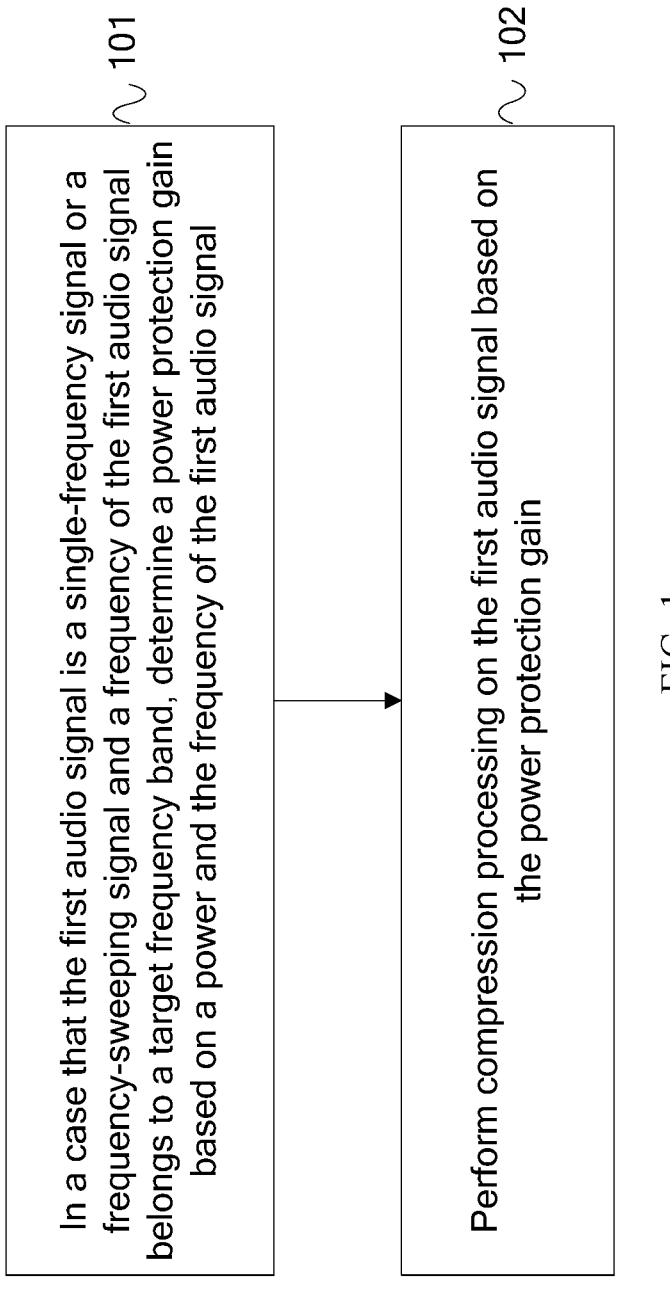

In a case that the first audio signal is a single-frequency signal or a frequency-sweeping signal and a frequency of the first audio signal belongs to a target frequency band, determine a power protection gain based on a power and the frequency of the first audio signal

~ 101

Perform compression processing on the first audio signal based on the power protection gain

AUDIO SIGNAL PROCESSING METHOD AND APPARATUS, ELECTRONIC DEVICE, AND STORAGE MEDIUM

CROSS-REFERENCE TO RELATED APPLICATIONS

This application is a continuation of International Application No. PCT/CN2022/081957, filed Mar. 21, 2022, which claims priority to Chinese Patent Application No. 202110321004.X, filed Mar. 25, 2021. The entire contents of each of the above-referenced applications are expressly incorporated herein by reference.

TECHNICAL FIELD

The present application relates to the field of electronic technologies, and in particular relates to an audio signal processing method and apparatus, an electronic device, and a storage medium.

BACKGROUND

Micro-speakers are used in portable electronic devices such as mobile phones, smart watches, and IoT terminals. A micro-speaker can withstand a limited power output of a power amplifier. If the output power of the power amplifier is too large, it is easy to cause a voice coil of the micro-speaker to overheat. When the temperature of the voice coil exceeds the maximum safe temperature, it is easy to cause damage to the micro-speaker.

In order to protect the micro-speaker, the method of fixing the power output of the power amplifier is often used at present. However, although the method of fixing the power output of the power amplifier can ensure that the voice coil of the micro-speaker is in a safe temperature range during working, when the micro-speaker plays single-frequency or frequency-sweeping signals, it is not friendly to the user's auditory system and will affect the user's auditory system.

SUMMARY

The purpose of the embodiments of the present application is to provide an audio signal processing method and apparatus, an electronic device, and a storage medium.

According to a first aspect, an embodiment of the present application provides an audio signal processing method, the method including:

determining, in a case that the first audio signal is a single-frequency signal or a frequency-sweeping signal and a frequency point of the first audio signal belongs to a target frequency band, a power protection gain based on a power and the frequency point of the first audio signal; and performing compression processing on the first audio signal based on the power protection gain.

According to a second aspect, an embodiment of the present application provides an audio signal processing apparatus, the apparatus including:

a power limiting module, configured to: determine, in a case that the first audio signal is a single-frequency signal or a frequency-sweeping signal and a frequency point of the first audio signal belongs to a target frequency band, a power protection gain based on a power and the frequency point of the first audio signal; and

a dynamic compression module, configured to perform compression processing on the first audio signal based on the power protection gain.

According to a third aspect, an embodiment of this application provides an electronic device. The electronic device includes a processor, a memory, and a program or an instruction stored in the memory and capable of running on the processor. When the program or the instruction is executed by the processor, the steps of the method according to the first aspect are implemented.

According to a fourth aspect, an embodiment of this application provides a readable storage medium. The readable storage medium stores a program or an instruction, and when the program or the instruction is executed by a processor, steps of the method according to the first aspect are implemented.

According to a fifth aspect, an embodiment of this application provides a chip. The chip includes a processor and a communications interface, the communications interface is coupled to the processor, and the processor is configured to run a program or an instruction, to implement the method according to the first aspect.

In the embodiments of the present application, in a case that the first audio signal is a single-frequency signal or a frequency-sweeping signal and a frequency point of the first audio signal belongs to a target frequency band, the power protection gain is determined based on a power and the frequency point of the first audio signal, and compression processing is performed on the first audio signal based on the power protection gain, which can ensure that the voice coil is in a safe temperature range when the speaker plays single-frequency or frequency-sweeping signals, and reduce the harm to the user's auditory system.

BRIEF DESCRIPTION OF DRAWINGS

FIG. 1 is a flowchart of an audio signal processing method provided in an embodiment of the present application;

DETAILED DESCRIPTION

Figure 2:
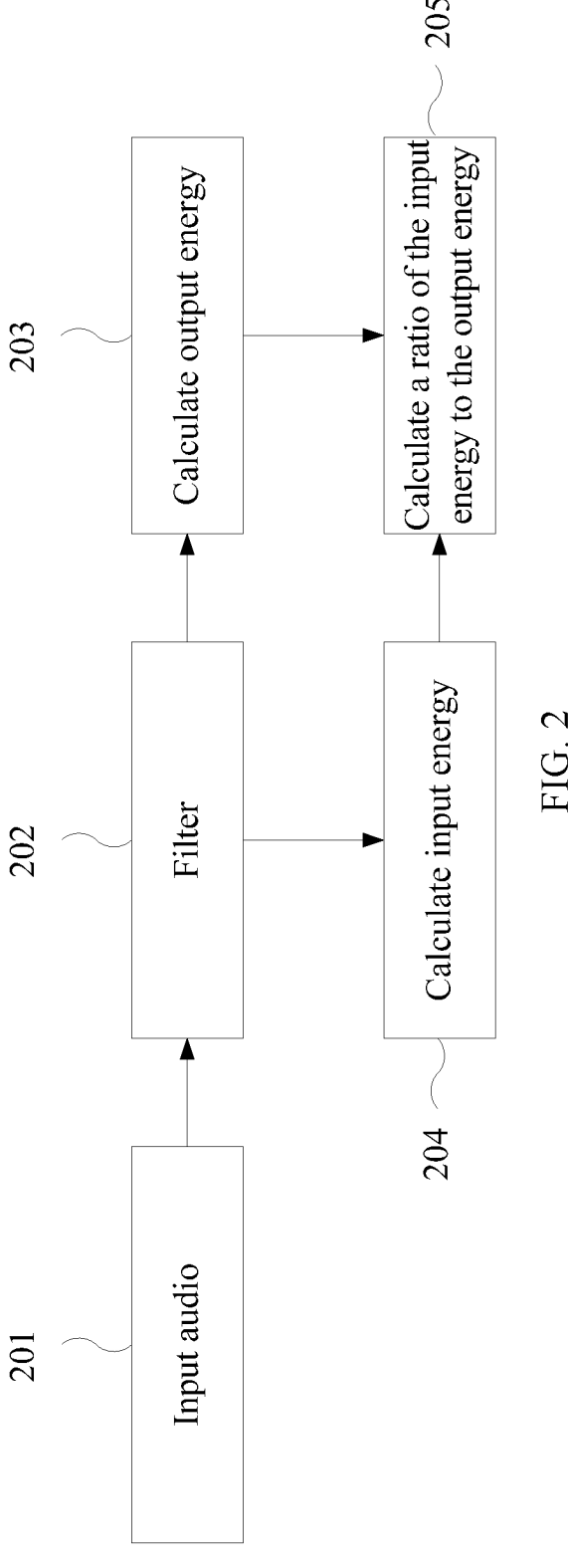
FIG. 2 is a flowchart of determining a type of a first audio signal in the audio signal processing method provided in an embodiment of the present application.

The following clearly describes the technical solutions in the embodiments of this application with reference to the accompanying drawings in the embodiments of this application. Obviously, the described embodiments are some but not all of the embodiments of this application.

The terms "first", "second", and the like in the description and the claims of this application are used to distinguish between similar objects, and do not need to be used to describe a specific order or sequence. It should be understood that, data termed in such a way is interchangeable in proper circumstances, so that the embodiments of this application can be implemented in an order other than the order illustrated or described herein. In addition, in the specification and the claims, "and/or" represents at least one of connected objects, and a character "/" generally represents an "or" relationship between associated objects.

The audio signal processing method and apparatus, electronic device, and storage medium provided by the embodiments of the present application will be described in detail below through specific embodiments and application scenarios with reference to the accompanying drawings.

FIG. 1 is a schematic flowchart of an audio signal processing method provided in an embodiment of the present application. The audio signal processing method provided by the embodiment of the present application is described below with reference to FIG. 1. As shown in FIG. 1, the method includes: step 101: determine, in a case that the first audio signal is a single-frequency signal or a frequency-sweeping signal and a frequency point of the first audio signal belongs to a target frequency band, a power protection gain based on a power and the frequency point of the first audio signal.

The audio signal processing method provided in the embodiment of the present application is executed by an audio signal processing apparatus.

The first audio signal may be a signal to be input to a speaker. In order to prevent the temperature of the voice coil of the speaker from being too high when the first audio signal is input into the speaker through a power amplifier, the audio signal processing method provided in the embodiment of the present application may be used to process the first audio signal, and then the first audio signal is input into the speaker through the power amplifier.

Types of audio signals may include three types: single-frequency signals, frequency-sweeping signals, and a type other than the two types.

In some embodiments, before step 101, the type of the first audio signal may be known in advance or the type of the first audio signal may be determined through detection.

In some embodiments, the first audio signal is a digital audio signal.

In some embodiments, determining the type of the first audio signal through detection includes: inputting the first audio signal into an Adaptive Notch Filter (ANF), and determining the whether the input first audio signal of is a single-frequency signal or a frequency-sweeping signal based on a change in input and output energy of the adaptive notch filter.

FIG. 2 is a schematic flowchart of determining a type of a first audio signal in the audio signal processing method provided in an embodiment of the present application. In some embodiments, as shown in FIG. 2, determining the type of the first audio signal may include the following steps:

Step 201: Input audio.

The first audio signal is input into the adaptive notch filter.

Step 202: Perform filtering.

The adaptive notch filter filters the narrowband portion of the first audio signal to obtain a third audio signal.

Step 203: Calculate output energy.

Energy of the third audio signal is calculated.

Step 204: Calculate input energy.

Energy of the first audio signal is calculated.

Step 205: Calculate a ratio of the input energy to the output energy.

If a ratio of the energy of the third audio signal to the energy of the first audio signal is smaller than a preset threshold, the type of the first audio signal is determined as a single-frequency signal or a frequency-sweeping signal.

The target frequency band is a predetermined frequency band.

In some embodiments, the target frequency band belongs to a middle frequency band in the human auditory range.

In the case that the first audio signal is a single-frequency signal or a frequency-sweeping signal, it may be determined in real time whether the channel frequency number of the first audio signal belongs to the target frequency band.

When the frequency point of the first audio signal belongs to the target frequency band, the power of the first audio signal is limited because the power of the single-frequency signal and the frequency-sweeping signal is relatively large.

Power limitation can be realized through voltage limiting, and the power protection gain G1 is used for control.

The power protection gain G1 may be determined based on the power and the frequency point of the first audio signal.

In some embodiments, the power protection gain G1 is less than or equal to 1.

In some embodiments, the power protection gain G1 may be determined based on a first model obtained in advance according to the power and the frequency point of the first audio signal.

The first model is used to describe the relationship between the power and the frequency point of the audio signal and the gain. The first model may be in the form of a two-dimensional table, a function, or a neural network model.

For example: each row in the two-dimensional table represents different power ranges, each column in the two-dimensional table represents different frequency bands, and an intersection point of the row and column is a gain. According to the power and the frequency point of the first audio signal, a row corresponding to the power range of the power of the first audio signal and the column corresponding to the frequency band of the frequency point of the first audio signal can be determined; and a gain at the intersection of the corresponding row and the corresponding column is determined as the power protection gain G1.

In some embodiments, when the first audio signal is neither a single-frequency signal nor a frequency-sweep signal (for example, the first audio signal is a music signal), the short-term power is small, and the power protection threshold can be dynamically adjusted to ensure that the output volume is loud enough to ensure a certain loudness.

In some embodiments, when the first audio signal is a single-frequency signal or a frequency-sweeping signal, and the frequency point of the first audio signal does not belong to the target frequency band, the power protection gain may be determined based on the power of the first audio signal.

Step 102: Perform compression processing on the first audio signal based on the power protection gain.

In some embodiments, in order to avoid that the temperature of the voice coil of the speaker is too high because the first audio signal is input to the speaker through the power amplifier, Dynamic Range Control (DRC) processing of the first audio signal can be implemented based on the power protection gain to achieve gain control.

In some embodiments, the power protection gain is less than or equal to 1, and the dynamic range control in this embodiment of the present application is to perform compression processing on the first audio signal.

In some embodiments, the first audio signal may be compressed only based on the power protection gain, or the first audio signal may be compressed based on the power protection gain and other protection gains.

In the case of performing compression processing on the first audio signal based on the power protection gain and other protection gains, the first audio signal may be compressed based on a product of the power protection gain and other protection gains.

The number of other protection gains can be one or more, which is used to limit the power of the signal input to the speaker from different aspects.

The audio signal obtained after processing the first audio signal in step 102 can be converted into an analog signal through a Digital-to-Analog Converter (DAC); and the power amplifier boosts the voltage of the analog signal based on a preset analog gain and then drives the signal to be output to the speaker.

Since the gain control of the first audio signal has been performed before the first audio signal is input into the power amplifier, even if the power amplifier performs power amplification, the power of the signal output to the speaker usually does not exceed the maximum allowable input power P-max of the voice coil of the speaker. Therefore, this will not cause the temperature of the voice coil of the speaker to be too high, so that the temperature protection of the speaker can be realized.

Since the human ear is not sensitive to the loudness of low-frequency signals and high-frequency signals, but is more sensitive to intermediate-frequency signals, the embodiment of the present application considers not only the power of the first audio signal but also the frequency point of the first audio signal when determining the power protection gain. When the frequency point of the first audio signal belongs to the intermediate frequency, additional suppression is performed on the intermediate frequency signal to ensure that the loudness is low enough, and the human ear will not produce auditory irritability. This is more friendly to the user's auditory system, and the harm to the user's auditory system is reduced.

In the embodiments of the present application, in a case that the first audio signal is a single-frequency signal or a frequency-sweeping signal and a frequency point of the first audio signal belongs to a target frequency band, the power protection gain is determined based on a power and the frequency point of the first audio signal, and compression processing is performed on the first audio signal based on the power protection gain, which can ensure that the voice coil is in a safe temperature range when the speaker plays single-frequency or frequency-sweeping signals, and reduce the harm to the user's auditory system.

In some embodiments, when the first audio signal is a single-frequency signal or a frequency-sweeping signal, and the frequency point of the first audio signal belongs to the target frequency band, before determining the power protection gain based on the power and the frequency point of the first audio signal, the method further includes: performing frequency response compensation processing on a second audio signal to obtain the first audio signal.

The second audio signal is an audio signal to be output through the speaker.

In some embodiments, the second audio signal may be a signal that is input to the audio signal processing device and to be output through a speaker.

The frequency response compensation processing can be performed on the second audio signal to increase the loudness of the low-frequency part of the signal output by the speaker, so that the loudness of the intermediate and high frequency parts of the signal output by the speaker is partially improved, the entire frequency response curve is flatter, and the sound pressure consistency of the signal output by the speaker is improved.

In some embodiments, performing frequency response compensation processing may be implemented by filtering and/or based on a second model.

For example: a filter or a filtering method for improving the frequency response of the low frequency part can be used to perform frequency response compensation processing on the second audio signal; or a second model for frequency response compensation can be established in advance according to the frequency response characteristics of the speaker, and after inputting the second audio signal to the second model, the second model may output the first audio signal.

In some embodiments, the second model may be in the form of a neural network model or the like.

The signal obtained after frequency response compensation is performed on the second audio signal is the first audio signal.

The method of fixing the power output of the power amplifier used to protect the micro-speaker limits the output power of the power amplifier too much, which causes the overall sound pressure level of the signal output by the loudspeaker to become smaller. Especially, the sound pressure of the low frequency part is insufficient. In the embodiment of the present application, by performing frequency response compensation on the second audio signal, the sound pressure consistency of the signal output by the loudspeaker can be improved.

In some embodiments, determining the power protection gain based on the power and the frequency point of the first audio signal includes: determining a first gain based on the power of the first audio signal, and determining a second gain based on the frequency point and a gain model of the first audio signal.

The gain model is used to map the relationship between the frequency point and the gain.

In some embodiments, the first gain Gp is used to limit the power of the first audio signal.

In some embodiments, the first gain Gp is less than or equal to 1.

Based on a predetermined correspondence between the power and the gain, the gain corresponding to the power of the first audio signal may be determined as the first gain Gp.

In some embodiments, the second gain Gc is used to limit the loudness of the intermediate frequency part in the first audio signal.

In some embodiments, the second gain Gc is less than or equal to 1.

The gain model can map a relationship between the frequency point and the gain. In some embodiments, the gain model may be in the form of a two-dimensional table, a function, or a neural network model.

For example, the gain model is a neural network model, the frequency point of the first audio signal is input to the gain model, and the gain model can output the second gain Gc; or the gain model is in the form of a function, the frequency point of the first audio signal is substituted into the gain model, and the second gain Gc can be calculated.

Based on the first gain and the second gain, the power protection gain is determined.

In some embodiments, the power protection gain G1 can be calculated by the following formula: G1=Gp*Gc.

In this embodiment of the present application, the first gain and the second gain are respectively determined based on the power and frequency point of the first audio signal, and the power protection gain is determined based on the first gain and the second gain, so that the first audio signal is processed based on the power protection gain. This can ensure that the voice coil is in a safe temperature range when the speaker plays single-frequency or frequency-sweeping signals, and reduce the harm to the user's auditory system.

In some embodiments, before determining the second gain based on the frequency point and the gain model of the first audio signal, the method further includes: determining the gain model based on equal loudness contours of target loudness and the target frequency band.

In some embodiments, the equal loudness contours refer to a group of curves in which the subjective perception of sound loudness (loudness level) obtained by measuring sound truly perceived by the human ear's is equal.

Figure 3:
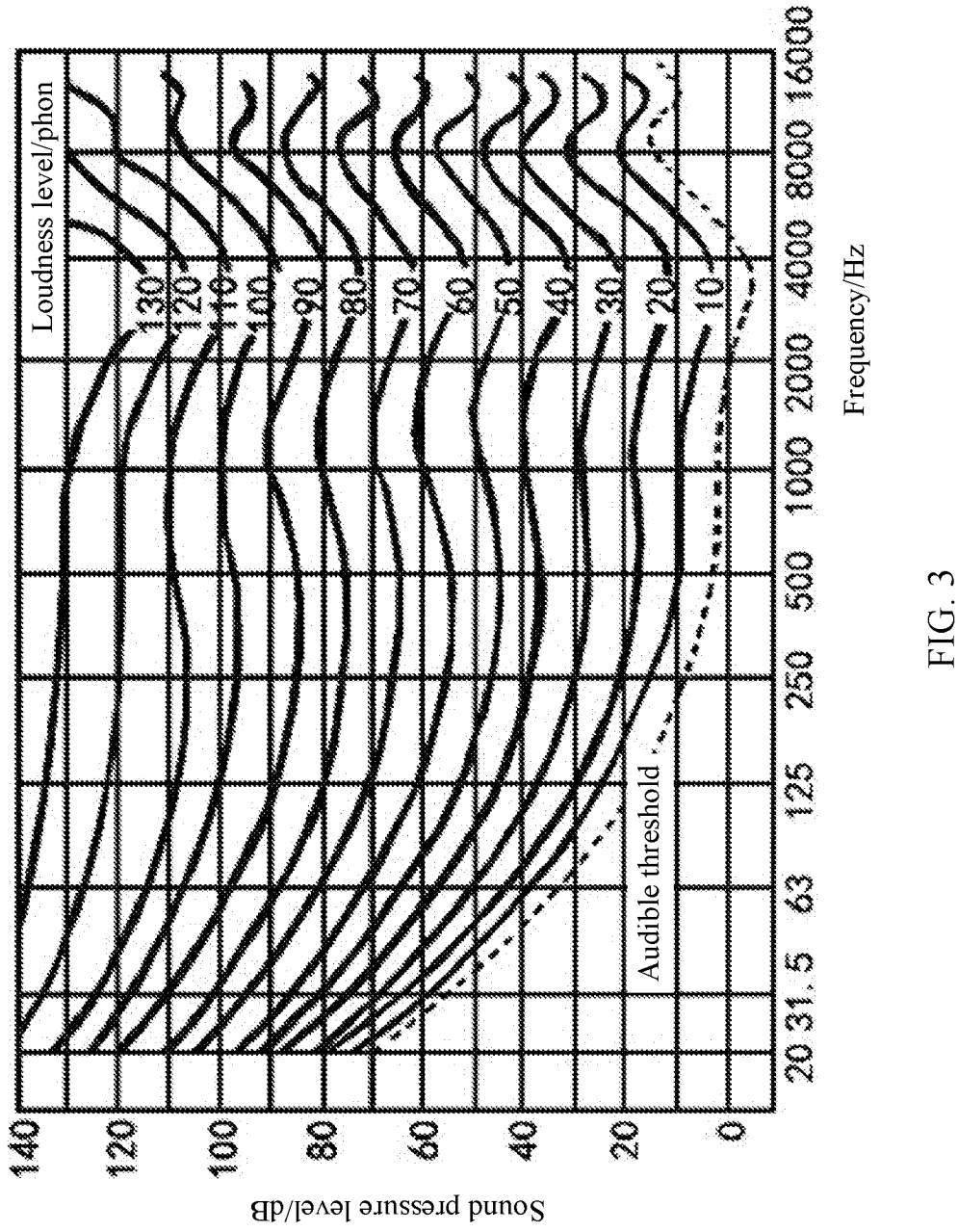
FIG. 3 is a schematic diagram of equal loudness contours in an audio signal processing method provided in an embodiment of the present application.

As shown in FIG. 3, the equal loudness contours of each loudness level are similar in shape, and any equal loudness contour can be selected, the loudness level corresponding to the equal loudness contours is the target loudness, and the equal loudness contour is an equal loudness contour of the target loudness.

In some embodiments, the target loudness is 80 phons.

A curve section corresponding to the target frequency band is selected from the equal loudness contour of the target loudness for fitting, and an approximate curve function is obtained.

In some embodiments, the minimum value of the curve function is at the bottom of the curve, and corresponds to the minimum gain of intermediate frequency suppression; the maximum value of the curve function is generally at the end point of the target frequency band, and the corresponding gain is 1.

The minimum gain of intermediate frequency suppression is less than 1, and its specific value can be set according to the actual situation. The embodiment of the present application does not specifically limit the value of the minimum gain for intermediate frequency suppression.

In some embodiments, the target frequency band may be determined according to an equal loudness contour of the target loudness.

The frequency corresponding to the lowest point in the equal loudness contour of the target loudness can be used as the center frequency of the target frequency band, and the frequency width of the target frequency band can be determined according to the lowest point and other poles closest to the lowest point, thereby determining the target frequency band.

In the embodiment of the present application, the gain model is determined based on the equal loudness contour of the target loudness and the target frequency band, so that a more suitable second gain can be determined based on the gain model, the voice coil can be guaranteed to be in a safe temperature range when the speaker plays a single-frequency or frequency-sweeping signal, and harm to the user's auditory system is reduced.

In some embodiments, determining the first gain based on the power of the first audio signal includes: determining the first gain as a preset value when the power of the first audio signal exceeds a target power.

The preset value is less than 1.

In some embodiments, it is determined whether the power of the first audio signal exceeds the target power.

In some embodiments, the target power corresponds to the maximum allowable input power P-max of the voice coil of the speaker. The target power can be preset according to the speaker and/or power amplifier or the like. The value of the target power is not specifically limited in this embodiment of the present application.

When the power of the first audio signal does not exceed the target power, the first gain Gp can be determined as 1; when the power of the first audio signal exceeds the target power, the first gain Gp can be determined as a preset value, and the preset value is less than 1.

In the embodiment of the present application, when the power of the first audio signal exceeds the target power, the first gain is determined to be a value less than 1, which can ensure that the power that the voice coil bears when the speaker plays a single-frequency or frequency-sweeping signal does not exceed the maximum allowable input power of the voice coil of the speaker and can ensure that the voice coil is in a safe temperature range when the speaker plays single-frequency or sweep-frequency signals.

In some embodiments, performing compression processing on the first audio signal based on the power protection gain includes: performing compression processing on the first audio signal based on the power protection gain and a temperature protection gain obtained in advance.

In some embodiments, the total gain for processing the first audio signal may be determined based on the power protection gain and other protection gains.

Other protection gains may include a temperature protection gain G2.

In some embodiments, the temperature protection gain G2 is a gain determined based on the instantaneous temperature of the speaker and/or the ambient temperature, and is used to prevent the instantaneous temperature of the speaker from exceeding the maximum safe temperature T-max.

The maximum safe temperature T-max can be preset based on the voice coil of the speaker. The embodiment of the present application does not specifically limit the value of the maximum safe temperature.

The instantaneous temperature of the speaker is usually the instantaneous temperature of the voice coil of the speaker.

In some embodiments, the temperature protection gain G2 and the power protection gain G1 are determined in sequence, and the temperature protection gain G2 is determined after the power protection gain G1 is determined.

The total gain may be the product of the power protection gain G1 and the temperature protection gain G2.

After the total gain is determined, the first audio signal may be compressed based on the total gain.

In the embodiment of the present application, the total gain is determined based on the power protection gain and the temperature protection gain, which can better ensure that the voice coil is in a safe temperature range when the speaker plays a single-frequency or frequency-sweeping signal, and reduce harm to the user's auditory system.

In some embodiments, before compressing the first audio signal based on the power protection gain and the temperature protection gain obtained in advance, the method includes: predicting an instantaneous temperature of the speaker; and in a case that a prediction result of the instantaneous temperature of the speaker exceeds a maximum safe temperature, determining the temperature protection gain based on the prediction result of the instantaneous temperature of the speaker.

In some embodiments, the step of obtaining the temperature protection gain G2 may include:

predicting an output power of the speaker;

predicting the instantaneous temperature of the speaker based on the prediction result of the output power and a preset temperature model; and determining the temperature protection gain based on the prediction result of the instantaneous temperature of the speaker.

Predicting the output power of the speaker includes:

converting, into an output voltage, a virtual output signal obtained after performing analog processing on the first audio signal based on the power protection gain;

calculating an output valid value according to the output voltage; and obtaining a current prediction result of the output power of the speaker according to the output valid value and a rated impedance of the speaker.

The temperature model is a thermally equivalent electrical model that describes the heat absorption and heat dissipation characteristics of the voice coil and magnet, such as thermal resistance and thermal capacitance, and the temperature of the voice coil and magnet can be estimated by the temperature model.

Figures 4, 5:
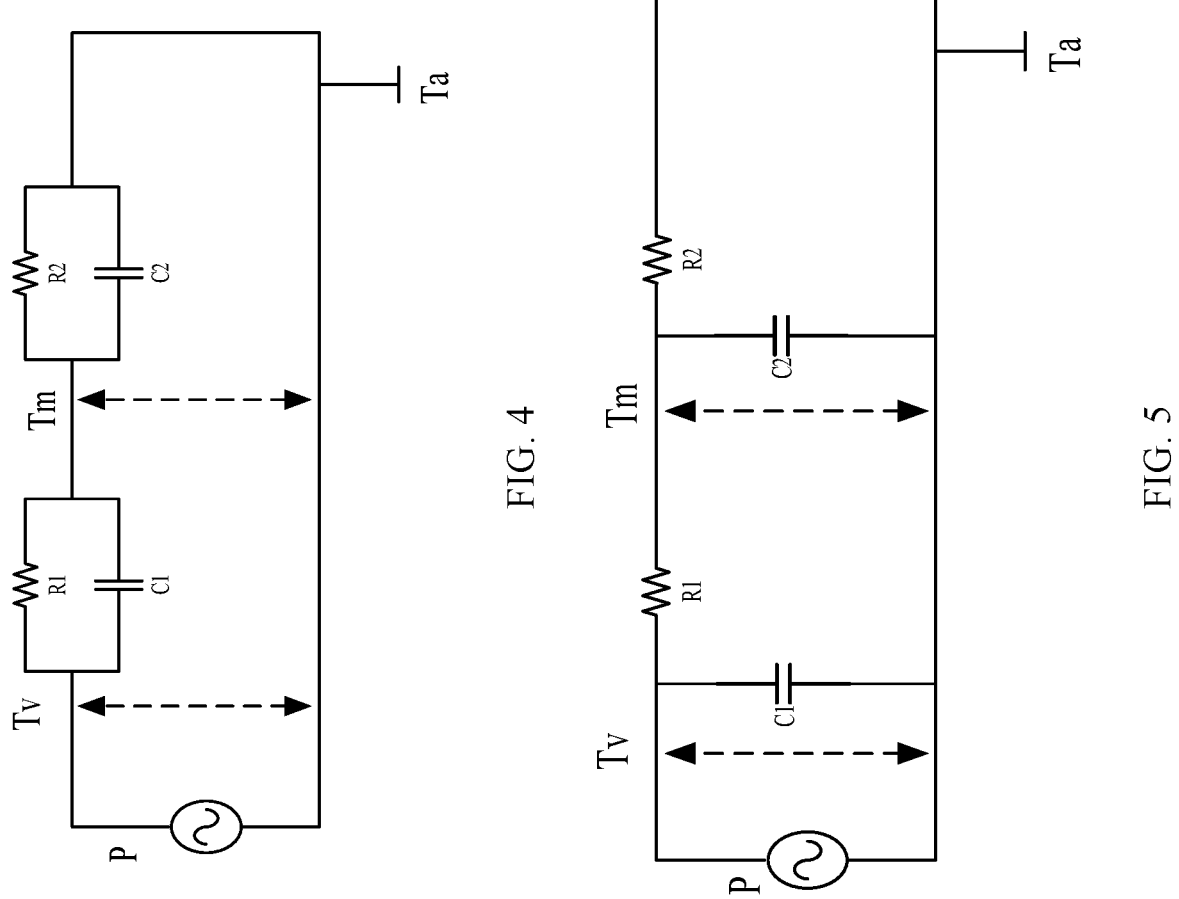
FIG. 4 is a schematic diagram 1 of a temperature model in the audio signal processing method provided by an embodiment of the present application.
FIG. 5 is a schematic diagram 1 of a temperature model in the audio signal processing method provided by an embodiment of the present application.

Common linear temperature models are shown in FIG. 4 and FIG. 5. The thermal resistance and thermal capacitance of the voice coil are represented by R1 and C1 respectively, the thermal resistance and thermal capacitance of the magnet are represented by R2 and C2 respectively, and P is the output power of the speaker. Tv represents the temperature of the voice coil, Tm represents the temperature of the magnet, and Ta is the ambient temperature.

In some embodiments, the temperature model is not limited to a second-order model, and a third-order model can be used to more accurately estimate the temperature change caused by amplitude heat dissipation.

The calculation formula of temperatures of the voice coil and the magnet corresponding to FIG. 4 is as follows:

$$\frac{T_v}{P} = \frac{R_1 + R_2 + s(R_1R_2C_2 + R_1R_2C_1)}{1 + s(R_1C_1 + R_2C_2) + s^2(R_1C_1R_2C_2)} \quad (1)$$

$$\frac{T_m}{P} = \frac{R_2}{1 + s(R_2C_2)} \quad (2)$$

The calculation formula of temperatures of the voice coil and the magnet corresponding to FIG. 5 is as follows:

$$\frac{T_v}{P} = \frac{R_1 + R_2 + s(R_1R_2C_2)}{1 + s(R_1C_1 + R_2C_1 + R_2C_2) + s^2(R_1C_1R_2C_2)} \quad (3)$$

$$\frac{T_m}{P} = \frac{R_2}{1 + s(R_1C_1 + R_2C_1 + R_2C_2) + s^2(R_1C_1R_2C_2)} \quad (4)$$

s is a complex frequency in Laplace transform.

The prediction result of the output power is used as the input of the temperature model, and the temperature Tv of the voice coil can be obtained as the prediction result of the instantaneous temperature of the speaker.

It is determined whether the prediction result of the instantaneous temperature of the speaker exceeds the maximum safe temperature T-max.

If yes, the temperature protection is triggered, and the temperature protection gain G2 is determined as a preset value or a random value. The preset value and the random value are both less than 1. If not, the temperature protection may not be triggered and the temperature protection gain G2 can be determined as 1 or gradually restores to 1.

In the embodiment of the present application, when the prediction result of the instantaneous temperature of the speaker exceeds the maximum safe temperature, the temperature protection gain is triggered to compress the first audio signal based on the power protection gain and the temperature protection gain, which can better ensure that the voice coil is in a safe temperature range when the speaker plays single-frequency or sweep-frequency signals, and reduce harm to the user's auditory system.

In order to facilitate the understanding of the above-mentioned embodiments of the present application, an example is used below to illustrate the implementation process of the audio signal processing method.

Figure 6:
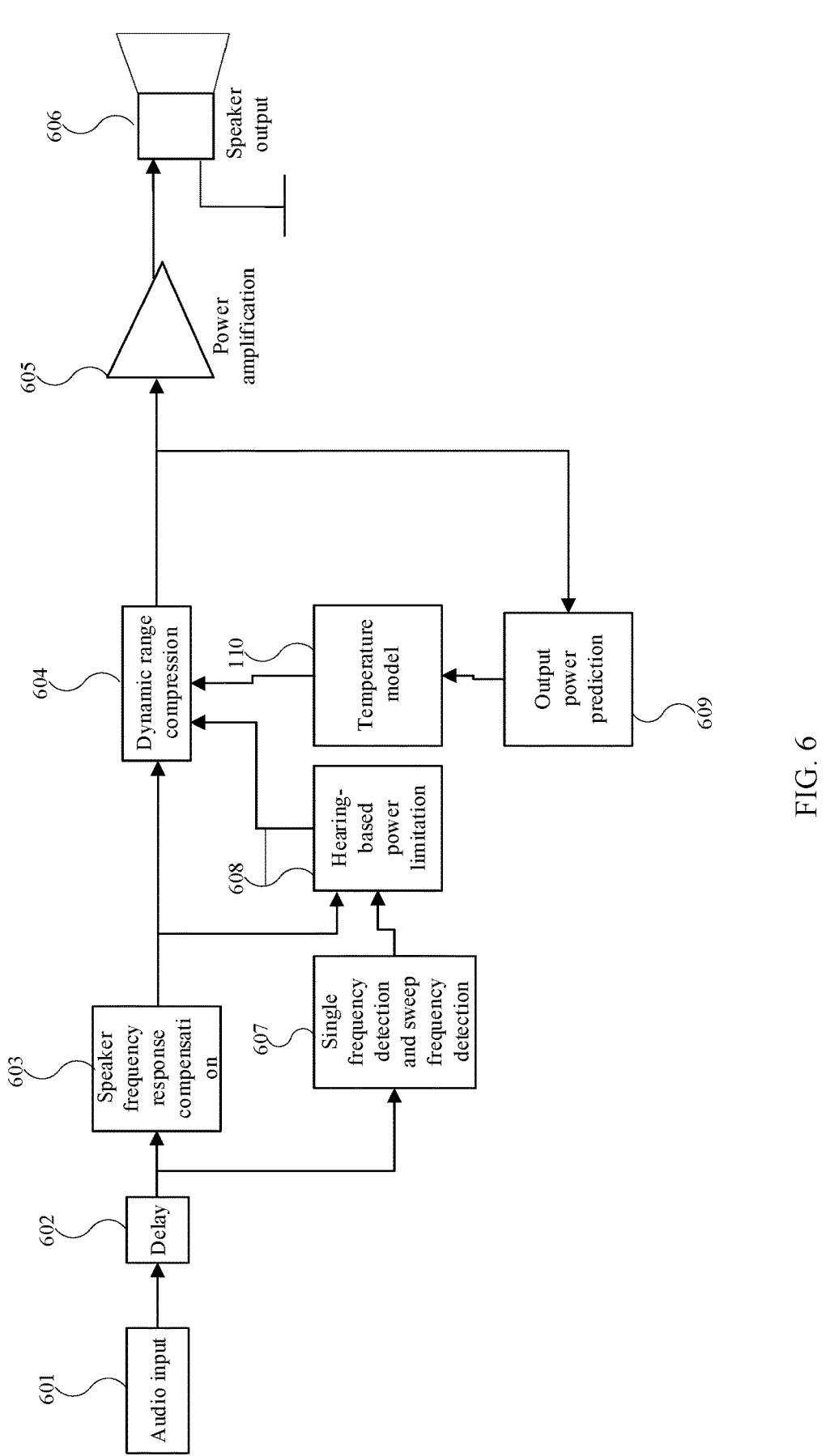
FIG. 6 is a flowchart of an audio signal processing method provided in an embodiment of the present application.

FIG. 6 is a schematic flowchart of an audio signal processing method provided in an embodiment of the present application. As shown in FIG. 6, the audio signal processing method may include the following steps:

Step 601: Perform audio input.

An audio signal to be processed is input, and the audio signal is a digital audio signal.

Step 602: Delay.

The audio signal to be processed is delayed and buffered to obtain a second audio signal. A frame length of the second audio signal is N milliseconds (N>=1).

Step 603: Speaker frequency response compensation.

Frequency response compensation processing is performed on the second audio signal to obtain the first audio signal.

Step 604: Dynamic range compression.

Compression processing is performed on the first audio signal based on the total gain. The total gain is determined based on step 608 and step 610.

Step 605: Power amplification.

Power amplification is performed on the compressed first audio signal through the power amplifier.

Step 606: Speaker output.

The speaker outputs the amplified first audio signal.

Step 607: Single-frequency detection and frequency-sweep detection.

Because step 603 does not change the type of the signal, the type of the second audio signal is the same as the type of the first audio signal, and it can be determined whether the type of the first audio signal is a single-frequency signal or a sweep-frequency signal by detecting the type of the second audio signal.

Step 608: Hearing-based power limitation.

In a case that the first audio signal is a single-frequency signal or a frequency-sweeping signal and a frequency point of the first audio signal belongs to a target frequency band, a power protection gain is determined based on a power and the frequency point of the first audio signal.

Step 609: Output power prediction.

Based on the power protection gain and the power of the first audio signal, the output power of the speaker is predicted.

Step 610: Temperature model.

Based on the prediction result of the instantaneous temperature of the speaker and the temperature model, a temperature protection gain is determined.

Figure 7:
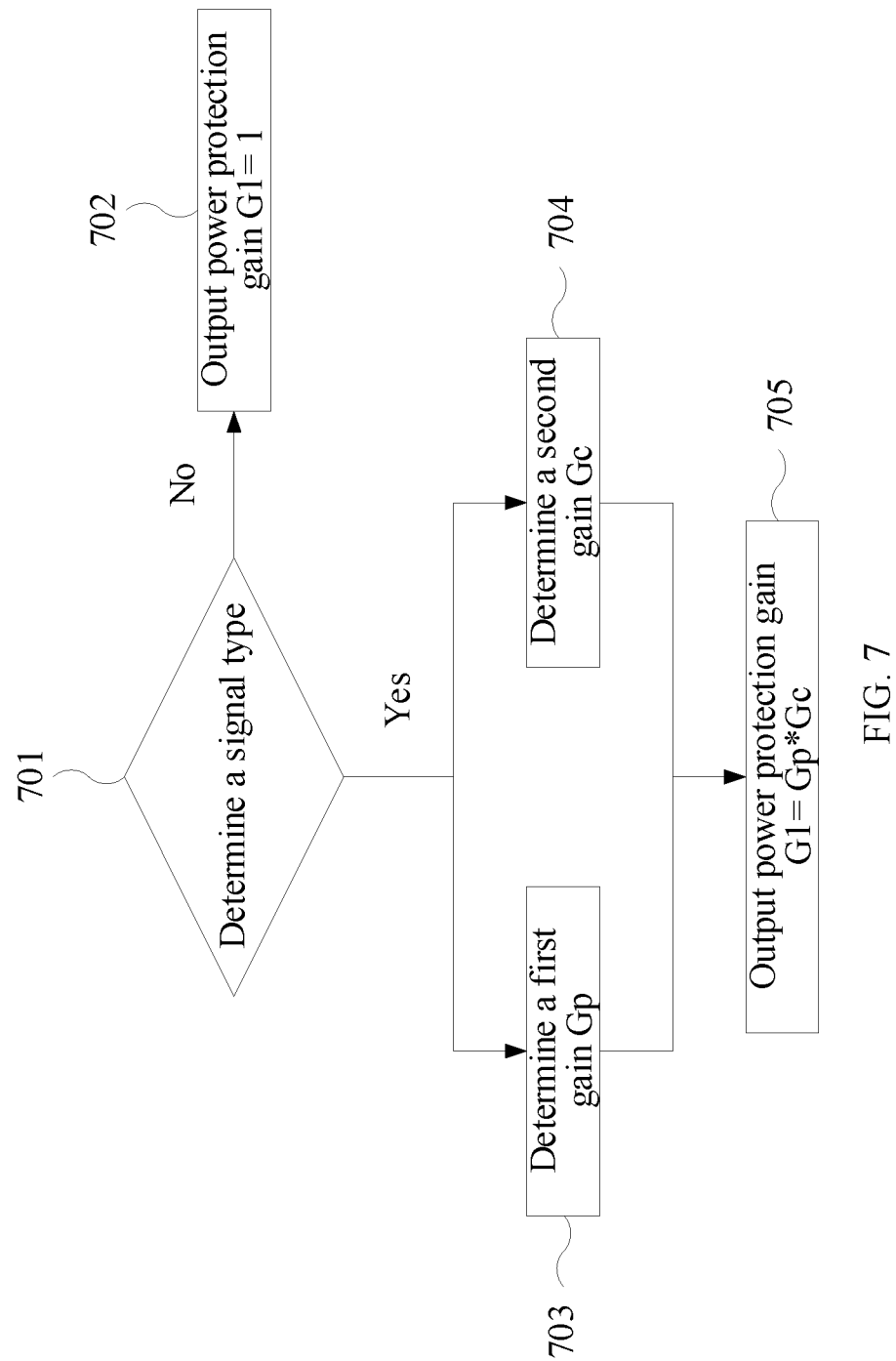
FIG. 7 is a flowchart of step 608 in FIG. 6.

FIG. 7 is a schematic flowchart of step 608 in FIG. 6. As shown in FIG. 7, step 608 includes the following steps:

Step 701: Determine a signal type.

Based on the detection result obtained in step 607, it is determined whether the first audio signal is a single-frequency signal or a frequency-sweeping signal.

If not, execute step 702. If yes, execute step 703 and step 704.

Step 702: Output power protection gain G1=1.

Step 703: Determine a first gain Gp.

Based on the power of the first audio signal, the first gain Gp is determined.

Step 704: Determine a second gain Gc.

Based on the frequency point of the first audio signal and the gain model, the second gain Gc is determined.

After step 703 and step 704 are executed, step 705 is executed.

Step 705: Output power protection gain G1=Gp*Gc.

It should be noted that, the audio signal processing method provided in the embodiment of the present application may be executed by an audio signal processing apparatus, or a control module in the audio signal processing apparatus for executing the audio signal processing method. In the embodiment of the present application, the audio signal processing method provided in the embodiment of the present application is described by taking an example in which the audio signal processing apparatus executes the audio signal processing method.

Figure 8:
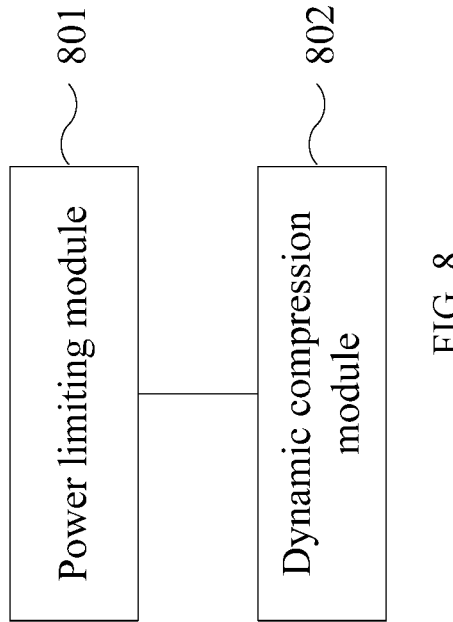
FIG. 8 is a schematic structural diagram of an audio signal processing apparatus provided in an embodiment of the present application.

FIG. 8 is a schematic structural diagram of an audio signal processing apparatus provided in an embodiment of the present application. As shown in FIG. 8, the apparatus includes: a power limiting module 801 and a dynamic compression module 802.

The power limiting module 801 is configured to: determine, in a case that the first audio signal is a single-frequency signal or a frequency-sweeping signal and a frequency point of the first audio signal belongs to a target frequency band, a power protection gain based on a power and the frequency point of the first audio signal.

The dynamic compression module 802 is configured to perform compression processing on the first audio signal based on the power protection gain.

In some embodiments, the audio signal processing apparatus further includes:

a frequency response compensation module, configured to perform frequency response compensation processing on a second audio signal to obtain the first audio signal;

The second audio signal is an audio signal to be output through the speaker.

In some embodiments, the power limiting module 801 includes:

a first determining submodule, configured to determine a first gain based on the power of the first audio signal;

a second determining submodule, configured to determine a second gain based on the frequency point and a gain model of the first audio signal; and a third determining submodule, configured to determine the power protection gain based on the first gain and the second gain.

The gain model is used to map the relationship between the frequency point and the gain.

In some embodiments, the power limiting module 801 further includes:

a model establishment submodule, configured to determine a gain model based on an equal loudness contour of target loudness and the target frequency band.

In some embodiments, the first determining submodule is configured to determine the first gain as a preset value when the power of the first audio signal exceeds a target power.

The preset value is less than 1.

In some embodiments, the dynamic compression module 802 is configured to perform compression processing on the first audio signal based on the power protection gain and the temperature protection gain obtained in advance.

The audio signal processing apparatus further includes:

a temperature protection module, configured to predict an instantaneous temperature of the speaker; and in a case that a prediction result of the instantaneous temperature of the speaker exceeds a maximum safe temperature, determine the temperature protection gain based on the prediction result of the instantaneous temperature of the speaker.

The audio signal processing apparatus in the embodiments of the present application may be an apparatus, or may be a component, an integrated circuit, or a chip in a terminal. The apparatus may be a mobile electronic device, or may be a non-mobile electronic device. For example, the mobile electronic device may be a mobile phone, a tablet computer, a laptop computer, a palmtop computer, an in-vehicle electronic device, a wearable device, an ultra-mobile personal computer (UMPC), a netbook, or a personal digital assistant (PDA). The non-mobile electronic device may be a server, a network attached storage (NAS), a personal computer (PC), a television (TV), an automated teller machine, or a self-service machine. This is not specifically limited in the embodiments of this application.

The audio signal processing apparatus in the embodiments of the present application may be an apparatus with an operating system. The operating system may be an Android operating system, may be an iOS operating system, or may be another possible operating system. This is not specifically limited in this embodiment of this application.

The audio signal processing apparatus provided in this embodiment of the present application can implement processes implemented by the audio signal processing apparatus in the method embodiments of FIG. 1 to FIG. 7. To avoid repetition, details are not described herein again.

In the embodiments of the present application, in a case that the first audio signal is a single-frequency signal or a frequency-sweeping signal and a frequency point of the first audio signal belongs to a target frequency band, the power protection gain is determined based on a power and the frequency point of the first audio signal, and the first audio signal is processed based on the power protection gain, which can ensure that the voice coil is in a safe temperature range when the speaker plays single-frequency or frequency-sweeping signals, and reduce the harm to the user's auditory system.

Figure 9:
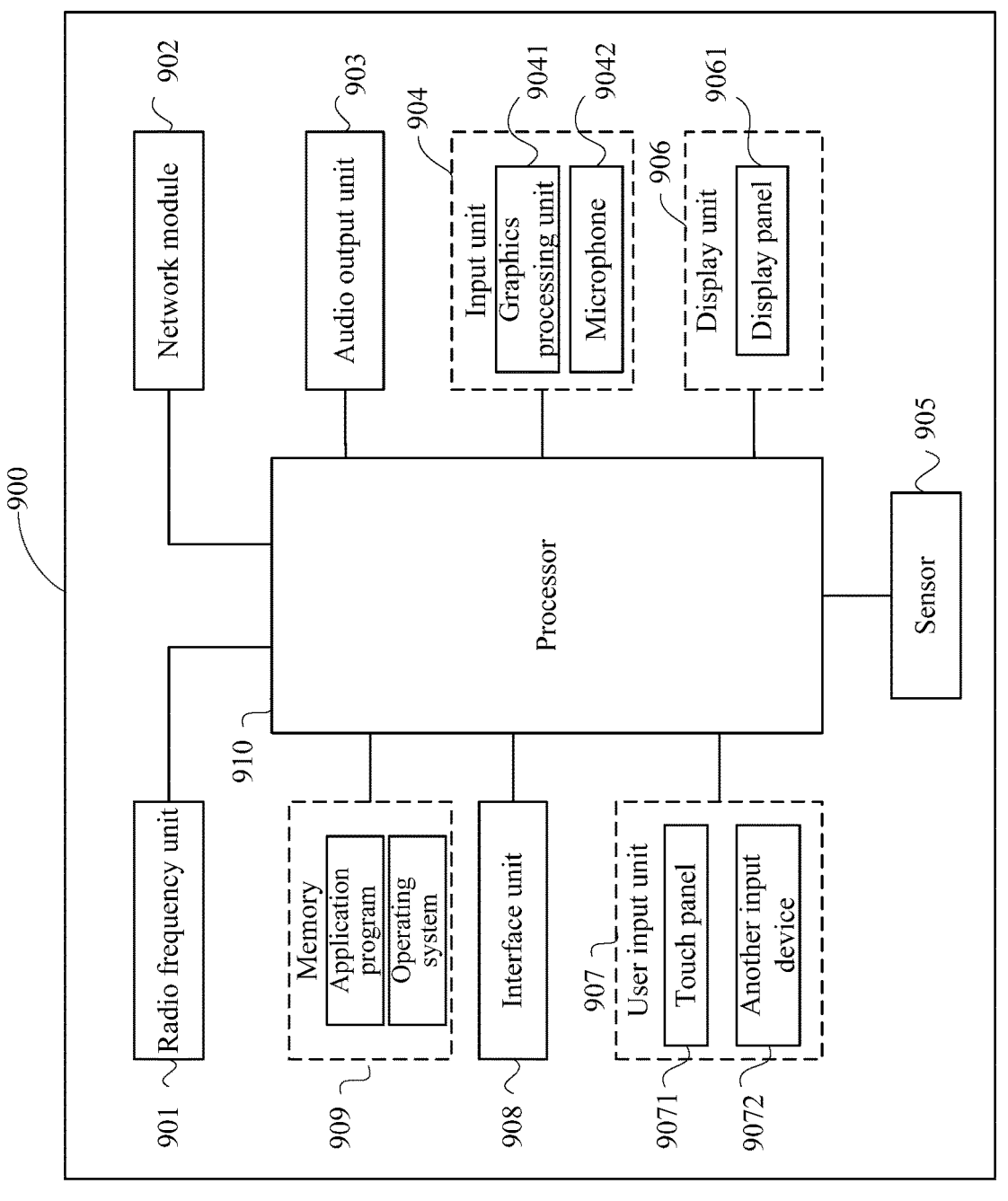
FIG. 9 is a schematic structural diagram of hardware of an electronic device according to an embodiment of this application.

FIG. 9 is a schematic structural diagram of hardware of an electronic device according to an embodiment of this application. As shown in FIG. 9, the electronic device 900 includes, but is not limited to: a radio frequency unit 901, a network module 902, an audio output unit 903, an input unit 904, a sensor 905, a display unit 906, a user input unit 907, an interface unit 908, a memory 909, a processor 910, etc.

It may be understood by a person skilled in the art that the electronic device 900 may further include a power supply (such as a battery) that supplies power to each component. The power supply may be logically connected to the processor 910 by using a power management system, to implement functions such as charging, discharging, and power consumption management by using the power management system. A structure of the electronic device shown in FIG. 9 does not constitute a limitation on the electronic device, and may include more or fewer parts than those shown in the figure, or combine some components, or have different part arrangements. Details are not described herein again.

It should be understood that, in the embodiments of this application, the input unit 904 may include a Graphics Processing Unit (GPU) 9041 and a microphone 9042, and the graphics processing unit 9041 processes image data of a still picture or video obtained by an image capture apparatus (such as a camera) in a video capture mode or an image capture mode. The display unit 906 may include a display panel 9061, and the display panel 9061 may be configured in a form of a liquid crystal display, an organic light emitting diode, or the like. The user input unit 907 includes a touch panel 9071 and another input device 9072. The touch panel 9071 is also referred to as a touchscreen. The touch panel 9071 may include two parts: a touch detection apparatus and a touch controller. The another input device 9072 may include but is not limited to a physical keyboard, a functional button (such as a volume control button or a power on/off button), a trackball, a mouse, and a joystick. Details are not described herein.

In this embodiment of this application, the radio frequency unit 901 receives downlink data from a network side device and then sends the downlink data to the processor 910 for processing; and sends uplink data to the network side device. Usually, the radio frequency unit 901 includes but is not limited to an antenna, at least one amplifier, a transceiver, a coupler, a low noise amplifier, a duplexer, and the like.

The memory 909 may be configured to store a software program or an instruction and various data. The memory 909 may mainly include a program or instruction storage area and a data storage area. The program or instruction storage area may store an operating system, and an application or an instruction required by at least one function (for example, a sound playing function or an image playing function). In addition, the memory 909 may include a high-speed random access memory, and may further include a non-volatile memory. The non-volatile memory may be a Read-Only Memory (ROM), a Programmable ROM (PROM), an Erasable PROM (EPROM), an Electrically EPROM (EEPROM), or a flash memory, for example, at least one disk storage device, a flash memory device, or another non-volatile solid-state storage device.

The processor 910 may include one or more processing units. In some embodiments, an application processor and a modem processor may be integrated into the processor 910. The application processor mainly processes an operating system, a user interface, an application, an instruction, or the like. The modem processor mainly processes wireless communications, for example, a baseband processor. It can be understood that, the modem processor may not be integrated into the processor 910.

The processor 910 is configured to: determine, in a case that the first audio signal is a single-frequency signal or a frequency-sweeping signal and a frequency point of the first audio signal belongs to a target frequency band, a power protection gain based on a power and the frequency point of the first audio signal; and perform compression processing on the first audio signal based on the power protection gain.

In the embodiments of the present application, in a case that the first audio signal is a single-frequency signal or a frequency-sweeping signal and a frequency point of the first audio signal belongs to a target frequency band, the power protection gain is determined based on a power and the frequency point of the first audio signal, and compression processing is performed on the first audio signal based on the power protection gain, which can ensure that the voice coil is in a safe temperature range when the speaker plays single-frequency or frequency-sweeping signals, and reduce the harm to the user's auditory system.

The processor 910 is further configured to perform frequency response compensation processing on the second audio signal to obtain the first audio signal; where the second audio signal is an audio signal to be output through the speaker.

The processor 910 is further configured to determine a first gain based on the power of the first audio signal, and determine a second gain based on the frequency point and a gain model of the first audio signal; and determine the power protection gain based on the first gain and the second gain; where the gain model is used to map a relationship between the frequency point and the gain.

The processor 910 is further configured to determine a gain model based on an equal loudness contour of target loudness and the target frequency band.

The processor 910 is further configured to determine the first gain as a preset value when the power of the first audio signal exceeds the target power; where the preset value is less than 1.

The processor 910 is further configured to perform compression processing on the first audio signal based on the power protection gain and the temperature protection gain obtained in advance.

The processor 910 is further configured to predict an instantaneous temperature of the speaker; and if a prediction result of the instantaneous temperature of the speaker exceeds a maximum safe temperature, determine the temperature protection gain based on the prediction result of the instantaneous temperature of the speaker.

The embodiment of the present application also provides a readable storage medium, the readable storage medium stores a program or an instruction, and when the program or instruction is executed by the processor, each process of the embodiment of the above audio signal processing method is realized, and the same technical effects can achieve, which are not repeated here to avoid repetition.

The processor is a processor in the electronic device in the foregoing embodiment. The readable storage medium includes a computer-readable storage medium such as a Read-Only Memory (ROM), a Random Access Memory (RAM), a magnetic disk, an optical disc, or the like.

An embodiment of the present application further provides a chip, the chip includes a processor and a communication interface, the communication interface is coupled to the processor, and the processor is configured to run programs or instructions to implement each process of the embodiment of the audio signal processing method and the same technical effects can be achieved. To avoid repetition, details are not described herein again.

It should be understood that the chip mentioned in this embodiment of this application may also be referred to as a system-level chip, a system chip, a system on chip, a system chip on chip, and the like.

It should be noted that in this specification, the term "include", "comprise", or any other variant is intended to cover non-exclusive inclusion, so that a process, method, article, or apparatus that includes a series of elements includes not only those elements but also other elements that are not explicitly listed, or includes elements inherent to such a process, method, article, or apparatus. An element limited by "includes a . . . " does not, without more constraints, preclude the presence of additional identical elements in the process, method, article, or apparatus that includes the element. In addition, it should be noted that the scope of the method and the apparatus in the embodiments of this application is not limited to performing functions in an illustrated or discussed sequence, and may further include performing functions in a basically simultaneous manner or in a reverse sequence according to the functions concerned. For example, the described method may be performed in an order different from that described, and the steps may be added, omitted, or combined. In addition, features described with reference to some examples may be combined in other examples.

Based on the descriptions of the foregoing implementations, a person skilled in the art may clearly understand that the method in the foregoing embodiment may be implemented by software in addition to a necessary universal hardware platform or by hardware only. Based on such an understanding, the technical solutions of this application essentially or the part contributing to existing technologies may be implemented in a form of a software product. The computer software product is stored in a storage medium (such as a ROM/RAM, a magnetic disk, or an optical disc) and includes several instructions for instructing a terminal (which may be a mobile phone, a computer, a server, an air conditioner, or a network device) to execute the methods described in the embodiments of this application.

The embodiments of this application are described above with reference to the accompanying drawings, but this application is not limited to the above specific implementations, and the above specific implementations are only illustrative and not restrictive. Under the enlightenment of this application, those of ordinary skill in the art can make many forms without departing from the purpose of this application and the protection scope of the claims, all of which fall within the protection of this application.

The invention claimed is:

1. An audio signal processing method, comprising:
determining, when a first audio signal is a single-frequency signal or a frequency-sweeping signal and a frequency point of the first audio signal belongs to a target frequency band, a power protection gain based on a power and the frequency point of the first audio signal; and
performing compression processing on the first audio signal based on the power protection gain.

2. The audio signal processing method according to claim 1, wherein before the determining, when the first audio signal is the single-frequency signal or the frequency-sweeping signal and the frequency point of the first audio signal belongs to the target frequency band, the power protection gain based on the power and the frequency point of the first audio signal, the method further comprises:
performing frequency response compensation processing on a second audio signal to obtain the first audio signal, wherein the second audio signal is an audio signal to be output through a speaker.

3. The audio signal processing method according to claim 1, wherein the determining the power protection gain based on the power and the frequency point of the first audio signal comprises:
determining a first gain based on the power of the first audio signal, and determining a second gain based on the frequency point and a gain model of the first audio signal; and
determining the power protection gain based on the first gain and the second gain,
wherein the gain model is used to map the relationship between the frequency point and the gain.

4. The audio signal processing method according to claim 3, wherein before the determining the second gain based on the frequency point and the gain model of the first audio signal, the method further comprises:

determining a gain model based on an equal loudness contour of target loudness and the target frequency band.

5. The audio signal processing method according to claim 3, wherein the determining the first gain based on the power of the first audio signal comprises:
determining the first gain as a preset value when the power of the first audio signal exceeds the target power, wherein the preset value is less than 1.

6. The audio signal processing method according to claim 1, wherein the performing the compression processing on the first audio signal based on the power protection gain comprises:
performing the compression processing on the first audio signal based on the power protection gain and a temperature protection gain obtained in advance.

7. The audio signal processing method according to claim 6, wherein before the performing the compression processing on the first audio signal based on the power protection gain and the temperature protection gain obtained in advance, the method comprises:
predicting an instantaneous temperature of a speaker; and
when a prediction result of the instantaneous temperature of the speaker exceeds a maximum safe temperature, determining the temperature protection gain based on the prediction result of the instantaneous temperature of the speaker.

8. An electronic device, comprising:
a memory storing a computer program; and
a processor coupled to the memory and configured to execute the computer program to perform operations comprising:
determining, when a first audio signal is a single-frequency signal or a frequency-sweeping signal and a frequency point of the first audio signal belongs to a target frequency band, a power protection gain based on a power and the frequency point of the first audio signal; and
performing compression processing on the first audio signal based on the power protection gain.

9. The electronic device according to claim 8, wherein before the determining, when the first audio signal is the single-frequency signal or the frequency-sweeping signal and the frequency point of the first audio signal belongs to the target frequency band, the power protection gain based on the power and the frequency point of the first audio signal, the operations further comprise:
performing frequency response compensation processing on a second audio signal to obtain the first audio signal, wherein the second audio signal is an audio signal to be output through a speaker.

10. The electronic device according to claim 8, wherein the determining the power protection gain based on the power and the frequency point of the first audio signal comprises:
determining a first gain based on the power of the first audio signal, and determining a second gain based on the frequency point and a gain model of the first audio signal; and
determining the power protection gain based on the first gain and the second gain,
wherein the gain model is used to map the relationship between the frequency point and the gain.

11. The electronic device according to claim 10, wherein before the determining the second gain based on the frequency point and the gain model of the first audio signal, the operations further comprise:

determining a gain model based on an equal loudness contour of target loudness and the target frequency band.

12. The electronic device according to claim 10, wherein the determining the first gain based on the power of the first audio signal comprises:

determining the first gain as a preset value when the power of the first audio signal exceeds the target power, wherein the preset value is less than 1.

13. The electronic device according to claim 8, wherein the performing the compression processing on the first audio signal based on the power protection gain comprises:

performing the compression processing on the first audio signal based on the power protection gain and a temperature protection gain obtained in advance.

14. The electronic device according to claim 13, wherein before the performing the compression processing on the first audio signal based on the power protection gain and the temperature protection gain obtained in advance, the operations comprise:

predicting an instantaneous temperature of a speaker; and when a prediction result of the instantaneous temperature of the speaker exceeds a maximum safe temperature, determining the temperature protection gain based on the prediction result of the instantaneous temperature of the speaker.

15. A non-transitory computer-readable storage medium, storing a computer program, when the computer program is executed by a processor, causes the processor to perform operations comprising:

determining, when a first audio signal is a single-frequency signal or a frequency-sweeping signal and a frequency point of the first audio signal belongs to a target frequency band, a power protection gain based on a power and the frequency point of the first audio signal; and performing compression processing on the first audio signal based on the power protection gain.

16. The non-transitory computer-readable storage medium according to claim 15, wherein before the determining, when the first audio signal is the single-frequency signal or the frequency-sweeping signal and the frequency point of the first audio signal belongs to the target frequency band, the power protection gain based on the power and the frequency point of the first audio signal, the operations further comprise:

performing frequency response compensation processing on a second audio signal to obtain the first audio signal, wherein the second audio signal is an audio signal to be output through a speaker.

17. The non-transitory computer-readable storage medium according to claim 15, wherein the determining the power protection gain based on the power and the frequency point of the first audio signal comprises:

determining a first gain based on the power of the first audio signal, and determining a second gain based on the frequency point and a gain model of the first audio signal; and determining the power protection gain based on the first gain and the second gain, wherein the gain model is used to map the relationship between the frequency point and the gain.

18. The non-transitory computer-readable storage medium according to claim 17, wherein before the determining the second gain based on the frequency point and the gain model of the first audio signal, the operations further comprise:

determining a gain model based on an equal loudness contour of target loudness and the target frequency band.

19. The non-transitory computer-readable storage medium according to claim 17, wherein the determining the first gain based on the power of the first audio signal comprises:

determining the first gain as a preset value when the power of the first audio signal exceeds the target power, wherein the preset value is less than 1.

20. The non-transitory computer-readable storage medium according to claim 15, wherein the performing the compression processing on the first audio signal based on the power protection gain comprises:

performing the compression processing on the first audio signal based on the power protection gain and a temperature protection gain obtained in advance.

* * * * *